(12) United States Patent
Gower et al.

(10) Patent No.: US 8,635,487 B2
(45) Date of Patent: *Jan. 21, 2014

(54) MEMORY INTERFACE HAVING EXTENDED STROBE BURST FOR WRITE TIMING CALIBRATION

(75) Inventors: Kevin C. Gower, LaGrangeville, NY (US); Kyu-hyoun Kim, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 457 days.

This patent is subject to a terminal disclaimer.

(21) Appl. No.: 12/723,843

(22) Filed: Mar. 15, 2010

(65) Prior Publication Data

US 2011/0225444 A1 Sep. 15, 2011

(51) Int. Cl.
*H03M 13/00* (2006.01)
*G06F 13/00* (2006.01)
*G06F 3/00* (2006.01)
*G11C 8/00* (2006.01)

(52) U.S. Cl.
USPC ........... 713/600; 711/167; 711/169; 711/105; 714/775; 714/738; 710/37; 365/230.08; 365/233.1

(58) Field of Classification Search
USPC .............. 365/230.08, 233.1, 233; 369/47.53; 702/177; 714/775, 738; 711/169, 167, 711/105; 375/219; 710/37, 22
See application file for complete search history.

(56) References Cited

U.S. PATENT DOCUMENTS

| | | | | |
|---|---|---|---|---|
| 5,544,124 A * | 8/1996 | Zagar et al. | | 365/230.08 |
| 6,671,652 B2 * | 12/2003 | Watson et al. | | 702/177 |
| 6,982,939 B2 * | 1/2006 | Powelson et al. | | 369/47.53 |
| 7,636,828 B2 * | 12/2009 | VanZante et al. | | 711/167 |
| 7,675,810 B2 * | 3/2010 | Kim et al. | | 365/233.1 |
| 7,889,593 B2 * | 2/2011 | Harrison | | 365/233.1 |
| 7,954,031 B2 * | 5/2011 | Manning | | 714/738 |
| 8,045,413 B2 * | 10/2011 | Demone | | 365/222 |
| 8,122,218 B2 * | 2/2012 | Mes | | 711/169 |
| 8,181,092 B2 * | 5/2012 | Lee et al. | | 714/775 |
| 2003/0007549 A1 * | 1/2003 | Kada et al. | | 375/219 |
| 2007/0025175 A1 * | 2/2007 | Liu et al. | | 365/233 |
| 2008/0104351 A1 * | 5/2008 | VanZante et al. | | 711/167 |
| 2008/0109571 A1 * | 5/2008 | Lee et al. | | 710/22 |
| 2010/0023657 A1 * | 1/2010 | Fukuda et al. | | 710/37 |
| 2010/0185810 A1 * | 7/2010 | Cline et al. | | 711/105 |

OTHER PUBLICATIONS

U.S. Appl. No. 12/723,885, filed Mar. 15, 2010, Kevin C. Gower et. al., "Memory Interface Having Extended Strobe Burst for Read Timing Calibration".

\* cited by examiner

*Primary Examiner* — Thomas Lee
*Assistant Examiner* — Aurel Prifti
(74) *Attorney, Agent, or Firm* — Patterson & Sheridan LLP

(57) ABSTRACT

Methods and systems for calibrating parameters for communication between a controller and a memory device. A memory controller may be configured to calibrate one or more of the write latency and/or the latency window of a memory device such that a data signal and a data strobe signal are received by the memory device within the latency window of the memory device.

16 Claims, 11 Drawing Sheets

MEMORY INTERFACE HAVING EXTENDED STROBE BURST FOR WRITE TIMING CALIBRATION

BACKGROUND

1. Field

The present invention generally relates to memory devices, and more specifically to calibration of parameters for communication between a controller and a memory device.

2. Description of the Related Art

Modern electronic systems generally contain one or more devices that communicate with each other over a bus. For example, a computer generally comprises a processor and/or memory controller that communicates with a memory device over a bus to access programs and data contained in the memory device. The performance of modern electronic devices such as processors and memories continues to improve by operating the devices at higher clock speeds. Increasing clock speed, however, can result in increased errors in the information communicated between the devices.

SUMMARY

The present invention generally relates to memory devices, and more specifically to calibration of parameters for communication between a controller and a memory device.

One embodiment of the invention provides a method for calibrating parameters of a memory device. The method generally comprises (a) setting a write latency of the memory device to a first value, (b) performing a write operation using the previously set write latency, and (c) performing a read operation to retrieve data written during the write operation. The method further comprises (d) determining whether the retrieved data is the same as data desired to be written during the write operation, and (e) upon determining that the retrieved data is not the same as data desired to be written during the write operation, adjusting the first value by at least once clock cycle and repeating steps (a)-(e) until the retrieved data is the same as data desired to be written during the write operation.

Another embodiment of the invention provides a method for calibrating parameters of a memory device. The method generally comprises (a) performing a write operation using a predefined write latency retrieved from the memory device, (b) performing a read operation to retrieve data written during the write operation, and (c) determining whether the retrieved data is the same as data desired to be written during the write operation. The method further comprises (d) upon determining that the retrieved data is not the same as data desired to be written during the write operation, adjusting a latency window of the memory device by at least once clock cycle and repeating steps (a)-(d) until the retrieved data is the same as data desired to be written during the write operation.

Yet another embodiment of the invention provides a system, generally comprising a memory device, and a memory controller. The memory controller is configured to (a) set a write latency of the memory device to a first value, (b) perform a write operation using the previously set write latency, and (c) perform a read operation to retrieve data written during the write operation. The memory controller is also configured to (d) determine whether the retrieved data is the same as data desired to be written during the write operation, and (e) upon determining that the retrieved data is not the same as data desired to be written during the write operation, adjust the first value by at least once clock cycle and repeat steps (a)-(e) until the retrieved data is the same as data desired to be written during the write operation.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENTS

Figure 1:
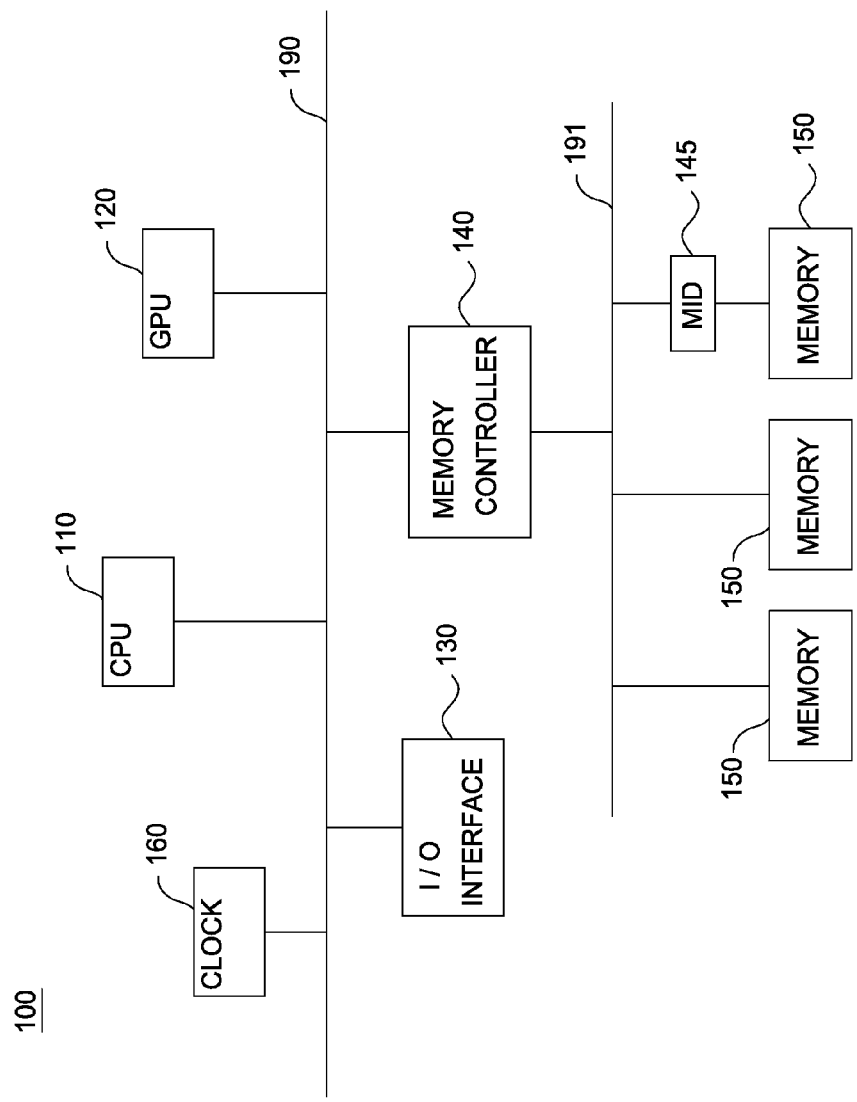
FIG. 1 illustrates an exemplary system according to an embodiment of the invention.

Embodiments of the invention are generally related to memory devices, and more specifically to calibration of parameters for communication between a controller and a memory device. A memory controller may be configured to calibrate one or more of a write latency and/or the latency window of a memory device such that a data signal and a data strobe signal is received by the memory device within the latency window of the memory device.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and nonvolatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of nonvolatile memory.

FIG. 1 illustrates an exemplary system 100 according to an embodiment of the invention. As illustrated, system 100 includes a central processing unit (CPU) 110, graphics processing unit (GPU) 120, input/output (IO) interface 130, a memory controller 140, one or more memory devices 150 (three such memory devices shown), and a clock 160. As illustrated in FIG. 1, CPU 110, GPU 120, I/O interface 130, memory controller 140, and clock 160 may be coupled to each other by a bus 190. The one or more memory devices 150 may be coupled to the memory controller 140 by a bus 191.

In some embodiments, a memory interface device 145, such as a buffer, register, or hub, may be located between memory controller 140 and one or more memory devices 150, and attached to bus 191. The interface device 145 may receive and re-drive one or more signals passing to and from a memory device 150, as well as perform other, higher level functions such as one or more of the conversion of received information from one format to another (e.g. from "packetized" to "parallel" interfaces), level conversion, data compression, data expansion, error detection, error checking, completing local memory control functions—directly requested by the memory controller and/or locally determined, etc. In alternative embodiments, the memory interface device 145 may be omitted. The exemplary arrangements of devices in FIG. 1 are provided herein for illustrative purposes only. In alternative embodiments, the devices of system 100 may be arranged differently. For example, in some embodiments, the I/O interface 130 may be coupled to the memory controller 140 instead of the bus 190.

CPU 110 may comprise one or more processor cores and one or more levels of cache memory. The one or more processor cores may be configured to execute instructions from a predetermined set of instructions. Each processor core may execute a sequence of instructions to perform one or more functions of the system, for example, text editing, displaying graphics, and the like. In one embodiment, the sequence of instructions may be performed in a pipelined manner to improve performance.

Graphics processing unit (GPU) 120 may be configured to receive graphics data, for example, 2-Dimensional and 3-Dimensional graphics data, from CPU 110, and/or memory devices 150. In one embodiment, GPU 120 may perform one or more computations to manipulate the graphics data, and render images on a display screen using, for example, IO interface 130.

IO interface 130 may provide an interface between the CPU 110 and an input or output device. Exemplary input devices include, for example, keyboards, keypads, light-pens, touch-screens, track-balls, speech recognition units, audio/video players, and the like. An output device can be any device to give output to the user, e.g., any conventional display screen.

Memory controller 140 may be configured to manage the flow of data to and from the one or more memory devices 150 and one or more other devices of system 100, e.g., CPU 110 and GPU 120. For example, memory controller 140 may be configured to receive data read and/or data write requests from one of the CPU 110, GPU 120, and/or IO interface 130. In response to receiving the requests, memory controller 140 may be configured to perform a read or write access to one of the memory devices 150 or memory interface device 145. While memory controller 140 is illustrated as a separate system device in FIG. 1, in alternative embodiments, memory controller 140 may be integrated with another device, for example, CPU 110.

Memory devices 150 may be a random access memories, for example, a dynamic random access memory (DRAM), synchronous DRAM (SDRAM), double data rate synchronous DRAM (DDR SDRAM), static random access memory (SRAM), and the like, sufficiently large to hold the necessary programming and data operated on by CPU 110. While each memory 150 is shown as a single entity, it should be understood that each memory 150 may be comprised of such elements as one or more memory devices, a combination of memory devices (e.g. a "stacked" package) functioning as one or more memory devices, one or more functional subsystems including memory and including one or more logic devices in some cases (e.g. a stacked package, multi-chip module, a memory card, a memory module ("DIMM"), etc.), and that memory 150 may exist at multiple levels, for example, L2 cache, L3 cache, main memory, and the like.

System 100 may be a synchronous system, in one embodiment. Accordingly, system 100 may comprise a clock 160 to generate a clock signal for the devices of system 100. The devices of system 100 may transfer and/or receive data from the bus 190/191 at a clock edge of the clock signal or another signal derived from the clock signal. In a particular embodiment, clock 160 may be a crystal oscillator. The clock signal generated by clock 160 may have a predetermined clock frequency. In one embodiment of the invention, one or more system devices, for example, processor 110, GPU 120, memory devices 150, and the like, may be configured to alter the frequency of the clock signal received from the clock 160. In alternative embodiments, the clock 160 may be configured to generate clock signals of different frequencies.

To improve system performance, the data transfer rates between system devices has been steadily increasing over the years. The increased data transfer rates have been achieved, in many cases, by operating system devices at higher clock frequencies. For example, the frequency of the clock signal generated by clock 160 may be increased. By increasing the clock frequency, data may be transferred faster on the busses 190 and 191, thereby improving performance.

Data may be exchanged between the various system devices using the busses 190 and 191. Busses 190 and 191 may include a plurality of parallel conductive lines for transferring a plurality of bits of data. In one embodiment, the bus 191 may include a control bus, address bus and/or a data bus (not shown in FIG. 1). A control bus may be used to exchange control signals, for example, write enable, chip select, data available, and the like. The address bus may be configured to transfer an address representing a memory location for storing or retrieving data. The data bus may be configured to transfer data to and from identified memory locations. In one embodiment of the invention, one or more conductive lines of memory bus 191 may be configured to transfer control bits, address bits and/or data bits.

Figure 2:
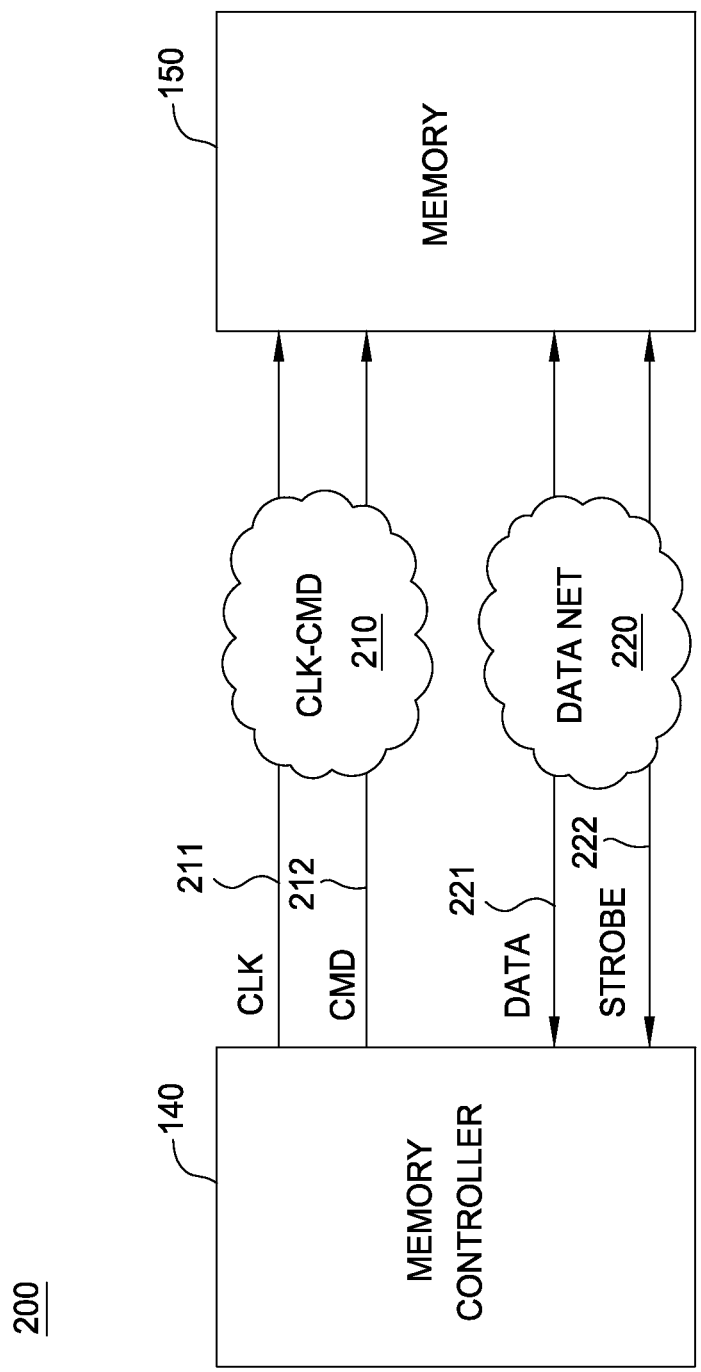
FIG. 2 illustrates an exemplary interface between a memory controller and a memory device, according to an embodiment of the invention.

FIG. 2 illustrates a more detailed view of the interface between a memory controller 140 and a memory device 150, according to an embodiment of the invention. As illustrated in FIG. 2, the memory controller 140 and/or memory interface device 145 may be coupled with the memory device 150 via a clock-command bus (CLK-CMD) 210 and a data bus 220. The CLK-CMD bus 210 and the data bus 220 may be a part of the data bus 191 illustrated in FIG. 1.

As illustrated in FIG. 2, the CLK-CMD bus 210 may include a clock signal line 211 and a plurality of command lines 212. The clock signal line 211 may be configured to transfer a clock signal from the memory controller 140 to the memory device 150. The clock signal may be a clock signal received by the memory controller 140 from the clock 160 (see FIG. 1). In an alternative embodiment, the clock signal transferred on the clock signal line 211 may be derived from a clock signal received from the clock 160, and may have a different frequency and/or phase than the clock signal received from the clock 160.

The plurality of command lines 212 may be configured to transfer command signals, e.g. read commands and write commands. In one embodiment, the CLK-CMD bus 210 may be a one-way transfer bus configured to transfer command signals and clock signals from the memory controller 140 to the memory device 150. In alternative embodiments, the CLK-CMD bus 210 may be a two-way bus configured to exchange command and clock signals between the memory controller 140 and the memory device 150.

The data bus 220 may include one or more data lines 221 and a data strobe line 222. The data lines 221 may be configured to transfer data signals between the memory controller 140 and the memory device 150. Data strobe signals transferred on the data strobe line 222 may oscillate during transfer of data on the data lines 211, thereby providing edges for sampling data on the data lines 221. In one embodiment, the data bus 220 may be a two-way transfer bus configured to transfer data and data strobe from the memory controller 140 to the memory device 150, and vice versa.

Figure 3:
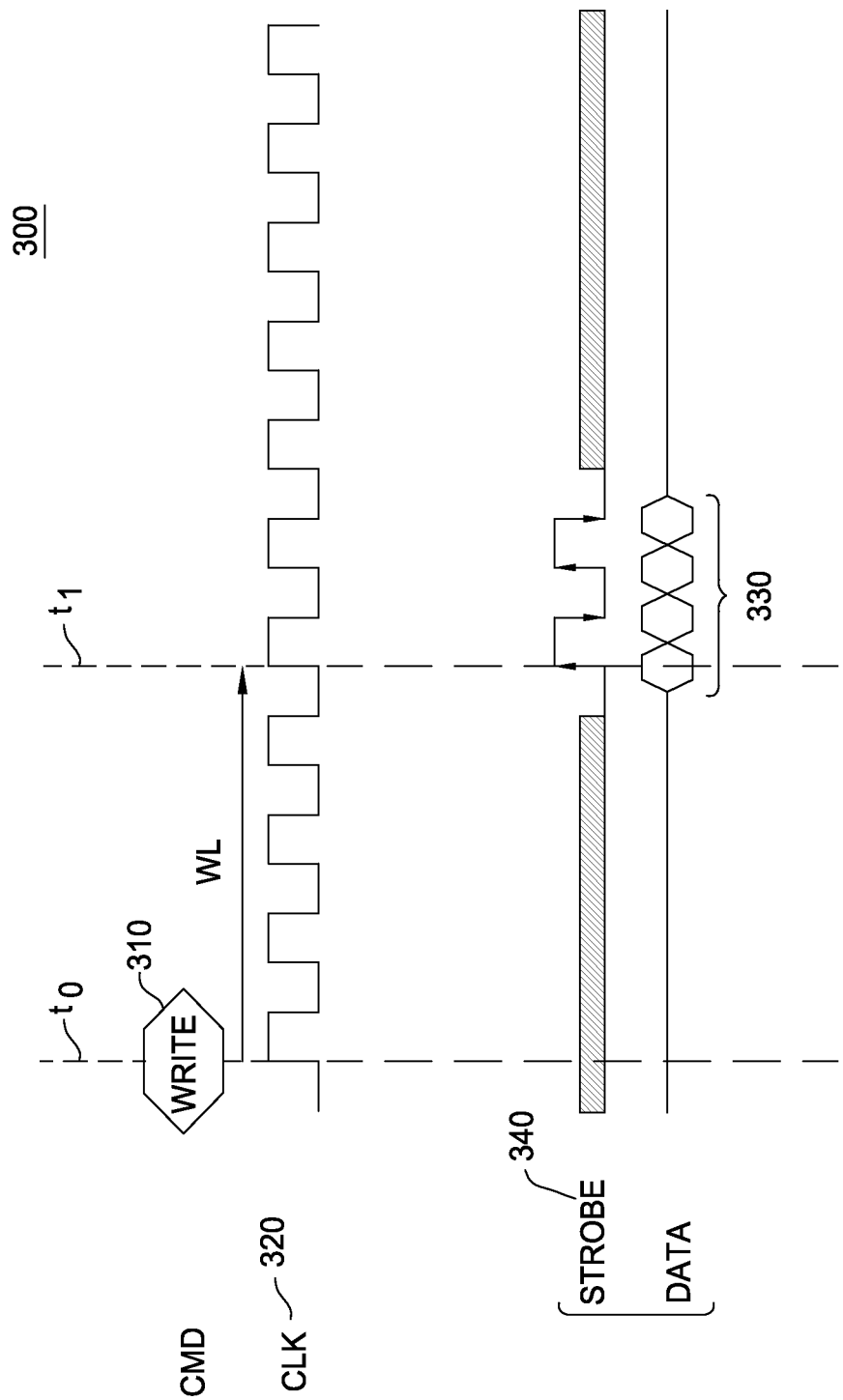
FIG. 3 is an exemplary timing diagram of a write operation, according to an embodiment of the invention.

FIG. 3 is an exemplary timing diagram illustrating a memory write operation, according to an embodiment of the invention. As illustrated in FIG. 3, the write operation may begin at time t0 by issuing a write command 310. The write command 310 may be sent by the memory controller 140, via command lines 212 of CMD-CLK bus 210 (see FIG. 2), to a memory device 150. A clock signal 320 that is sent from the memory controller 140 to the memory device 150 and/or memory interface device 145 is also shown in FIG. 3.

In one embodiment, after issuing the write command 310, the memory controller may send write data 330 and a strobe signal 340 after a predefined period of time known as the write latency (shown as WL in FIG. 3). The write latency may be a predefined parameter of the memory device 150 that defines a time required to access a location in the memory device, e.g., to perform the write operation 310. The predefined write latency of the memory device may be a write latency that is set, for example, by a manufacturer of the memory device. In alternate embodiments, memory device 150 may be operable with two or more write latencies, with the memory device to be programmed to operate with a given write latency in a given application. In FIG. 3, the write latency for a memory device 150 is shown as the time between t0 and t1. The memory controller may be configured to program the memory device with the "current" write latency during initialization of the memory system (e.g. a system within system 100, comprised of memory controller 140, the one or more buffers 145 and/or the one or more memory devices 150).

Referring to FIG. 3, at time t1, the strobe signal 340 starts oscillating for 2 clock cycles, thereby generating 4 sampling edges. The write data 330 is shown with a burst length (BL) of 4. Accordingly, 4 data eyes are shown in FIG. 3. As can be seen further in FIG. 3, the strobe signal 340 is generated by the controller(s) and/or buffer(s) sourcing the data to the one or more memory devices 150 such that each edge of the strobe signal is generated at the center of a respective data eye. While data transmission with a burst length of 4 is illustrated herein, in alternative embodiments, any reasonable burst length may be used while performing memory access operations, and other strobe-to-data timing relationships may be used such as edge-aligned strobes, etc.

Figure 4:
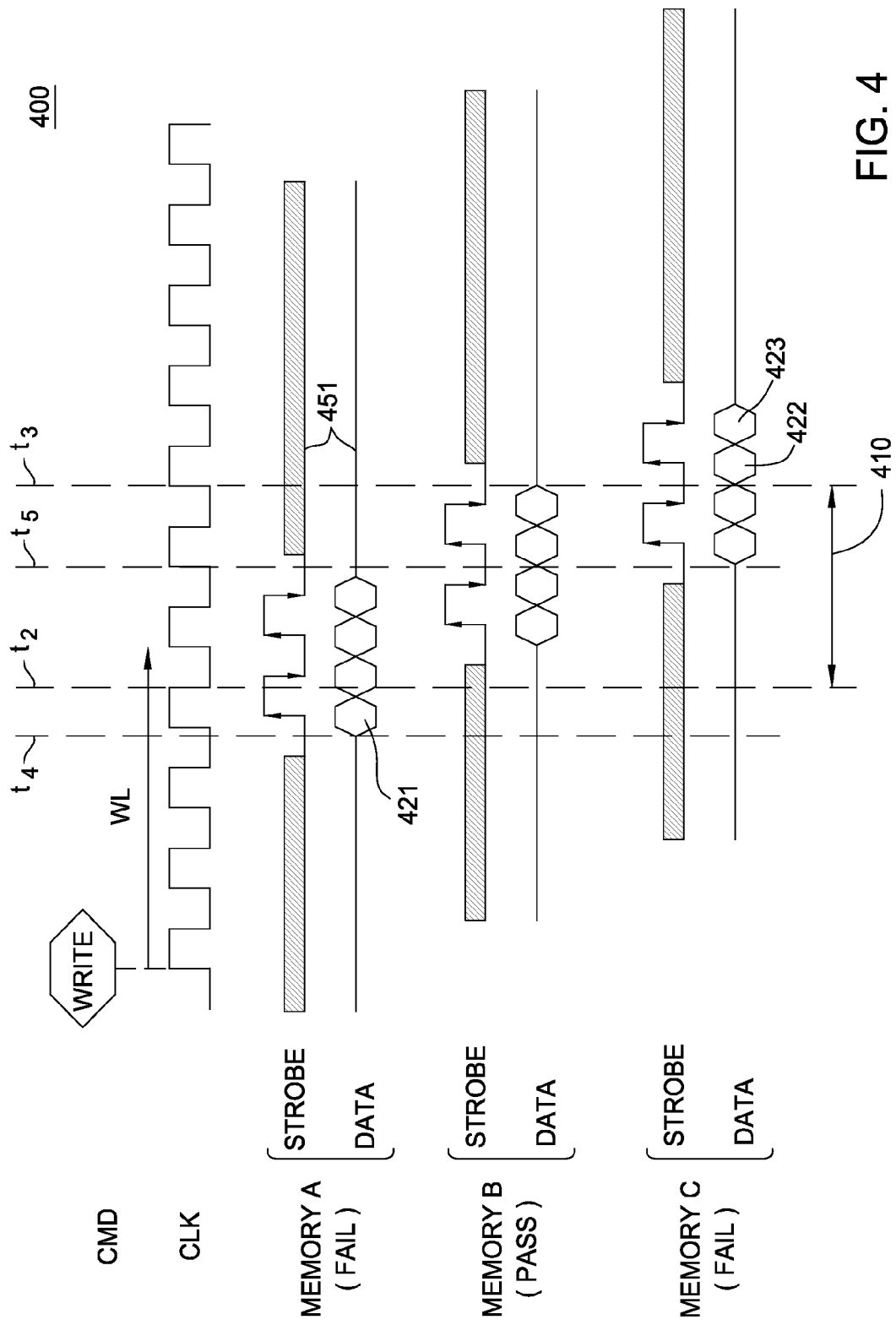
FIG. 4 is an exemplary timing diagram of a write operation performed at a plurality of memory devices.

In one embodiment, the memory device may define a latency window in which write data is expected to be received. FIG. 4 illustrates a memory latency window 410 between times t2 and t3, according to an embodiment of the invention. Also shown in FIG. 4 is a write operation 420 which may be simultaneously performed at three memory devices Memory A, Memory B, and Memory C. Memory devices A, B, and C, in this example, are presumed to be similar devices with similar operating parameters, e.g., predefined write latency and latency windows.

As illustrated in FIG. 4, the memory strobe signals and data signals sent by the memory controller may not reach all of the memory devices A, B, and C within the memory latency window 410. For example, the data strobe signal and the data signals may reach memory A too early at time t4. Because the data strobe and data signals reach memory device A too early, data in data eye 421 may not get captured accurately by memory device A. The data strobe and data signals may reach the memory device C too late at time t5, as illustrated in FIG. 4. Therefore, the data in data eyes 422 and 423 may not get captured accurately by the memory C. The data strobe and data signals may reach memory B within the latency window 410, as shown in FIG. 4. Therefore, only memory B may accurately capture the data transferred by the memory controller 140, or the memory interface device 145.

The differences in time of arrival of data strobe and data signals between memory devices may be caused by a variety of factors such as distance between the memory controller and each memory device, the relative lengths of the data bus connecting the memory controller and the memory devices, and the like. In general, the greater the distance that a signal has to travel on the data bus, the greater the latency, and vice versa.

Embodiments of the invention provide methods and apparatus for ensuring accurate transferring of data between a memory controller and a memory device within a latency window of the memory device. In one embodiment, the memory controller, buffer and/or other memory interface device may be configured to dynamically determine the actual operational write latency for each memory device connected thereto. The operations performed for determining the operational write latency are generally referred to herein as coarse calibration operations. In one embodiment, at startup and initialization of devices in system 100, the memory controller 140 may be configured to perform one or more operations for determining a write latency for each memory device 150 that is connected to the memory controller 140 and/or memory interface device 145. In some embodiments, the operations for determining the write latency for each memory device may be performed periodically, or at the occurrence of one or more predefined events such as, for example, the occurrence of a threshold number of transmission errors.

In one embodiment, the coarse calibration operations described herein may be performed after performing read calibration of memory devices. Any reasonable method may be used for performing the read calibration. For example, read timings might initially be set by attempting to read a preprogrammed data pattern from the memory device. Once this can be done accurately, then coarse calibration of write timings may be performed.

In one embodiment, during the operations for determining the write latency of a memory device in a system that may have a wide range of write window timings relative to a write command, the memory controller may be configured to write data to the memory device at different write latencies. Data written at each write latency may be read back from the memory device to determine the latency at which the data intended to be written was correctly captured by the memory device. In one embodiment, the memory controller may first send data at a predefined minimum write latency. Thereafter, the memory controller may send the data iteratively at increasing write latencies until data is within the latency window of respective memory device, and can therefore be accurately retrieved.

Figure 5:
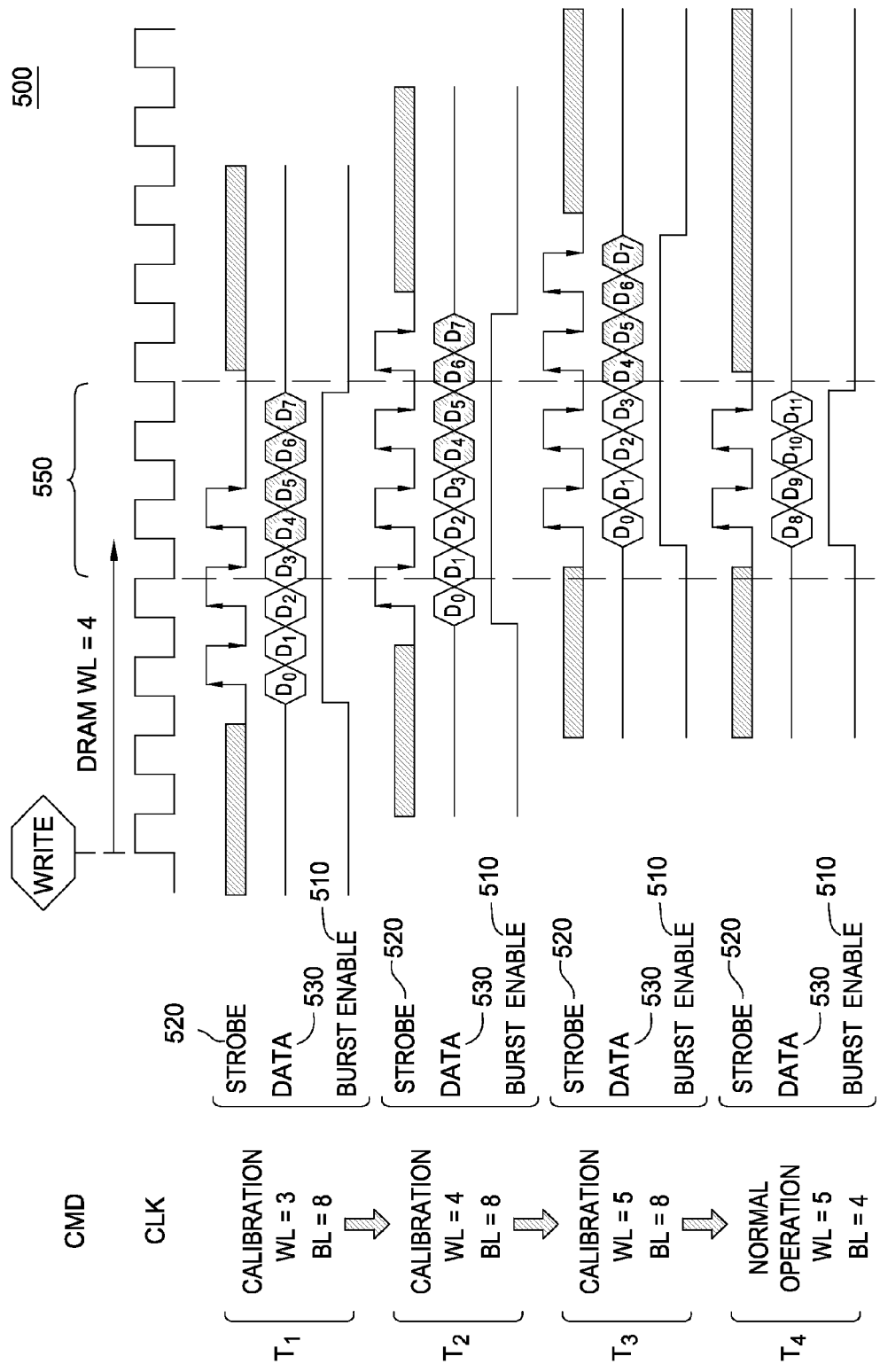
FIG. 5 illustrates an exemplary method for determining an operational write latency according to an embodiment of the invention.

FIG. 5 illustrates an exemplary method for determining the write latency of a memory device, according to an embodiment of the invention. As with previous examples in FIGS. 3 and 4, a memory device having a predefined write latency of 4 clock cycles is assumed. In one embodiment, during operations to determine an operational write latency for the memory device for accurate transmissions of data, the memory controller may first send data at a predefined minimum write latency. The operational write latency is defined herein as the write latency at which data and strobe signals are accurately received by the memory device within a predefined latency window of the memory device. The predefined minimum latency may be any latency that is lesser than a predefined write latency of the memory device. For example, as illustrated in FIG. 5, the minimum write latency may be 3, as illustrated in the initial transmission T1.

As further illustrated in FIG. 5, during the transmission T1, an exemplary burst length of the data may be greater than an operational burst length. The operational burst length is defined herein as the burst length that may be used during normal operation of the memory controller and the memory device. For example, in FIGS. 3 and 4, the operational burst length is 4. In one embodiment, the burst length used during operations for determining the operational write latency may be at least twice the operational burst length.

A greater burst length may be used during the operations to determine the operational write latency in order to avoid undesired values from being captured by the memory device. For example, referring back to the memory signals associated with memory A in FIG. 4, the data and data strobe signals are shown transitioning into a high Z or unknown state 451 within the latency window 410. Because Memory A expects data of a predefined burst length within the latency window, it is possible that the memory A may attempt to capture a high-Z value on the data bus.

Referring back to FIG. 5, by providing a burst length greater than the operational burst length, embodiments of the invention ensure that known data is present on the data bus within the latency window of the memory device. Therefore, the memory device may not capture high-Z values during the operations to determine the operational write latency. For example, in FIG. 5, during transmission T1, data D0-D7 may be transmitted. D0-D3 may represent the data that is intended to be written, while data D4-D7 may be additional data that is sent to provide an increased burst length with known data. A burst enable signal 510 may be generated along with the data strobe signal 520 and data signals 530 to indicate the presence of data D0-D7 on the data bus, as shown in FIG. 5.

In an exemplary embodiment, the data D0-D7 may have a predefined pattern which may allow the memory controller to determine whether intended data is written to the memory device, as well as which portion of any written data has been stored. For example, during transmission T1, it is likely that one or more of data D3-D7 is captured by the memory device because data D3-D7 are within the latency window 550. After the transmission T1, the memory controller may read back the written data. Because the intended data D0-D3 was not captured during the transmission T1, the memory controller may determine that the operational write latency is not 3.

Accordingly, the memory controller may increase the write latency by a predefined number of clock cycles, e.g., from 3 clock cycles to 4 clock cycles, for a second transmission T2 of data D0-D7. As illustrated in FIG. 5, during the second transmission T2, data D1-D5 fall within the latency window 550, and one or more of data D1-D5 is likely to be captured by the memory device. After reading back the data written to the memory device during transmission T2, the memory controller may determine that 4 clock cycles is not the operational write latency.

Accordingly, the memory controller may increment the write latency further from 4 clock cycles to 5 clock cycles for a third transmission to T3. As can be seen in FIG. 5, during the third transmission T3, intended data D0-D3 may fall within the latency window 550, and therefore data D0-D3 may be captured by the memory device. Upon reading back the data written during transmission T3, the memory controller may determine that 5 clock cycles is the appropriate operational write latency for future transmissions of data. Therefore, the memory controller may set the write latency for normal operation of the memory device to 5 clock cycles.

Upon determining that the operational write latency for the memory device is 5 clock cycles, the memory controller may reset the burst length to the predefined burst length of the memory device for future transmissions. FIG. 5 illustrates transmission (T4) of write data D8-D11 after the operational write latency has been determined. As shown, during transmission T4, a burst length of 4 and a write latency of 5 clock cycles is used, thereby placing the data D8-D11 within the latency window 550 of the memory device.

Figure 6:
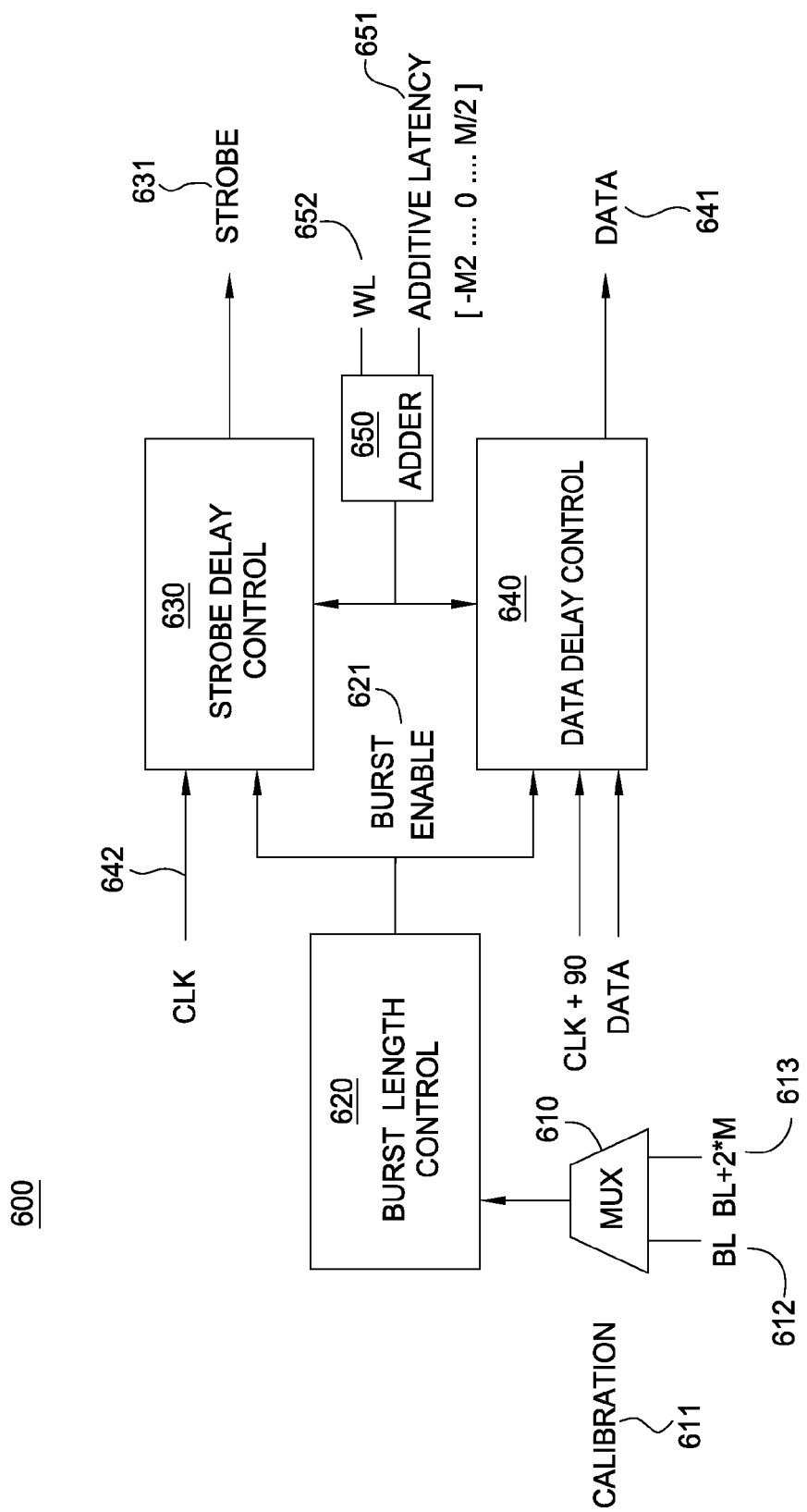
FIG. 6 illustrates exemplary circuitry of a memory controller, according to an embodiment of the invention.

FIG. 6 illustrates exemplary circuitry 600 within a memory controller and/or memory interface device, e.g., the memory controller 140 and/or memory interface device 145 of FIG. 1, configured to implement the write latency determining operations discussed above with reference to FIG. 5. As illustrated, the circuitry 600 may include a multiplexor (mux) 610, burst length control circuitry 620, strobe delay control circuitry 630, data delay control circuitry 640, and an adder 650.

The mux 610 may be configured to select a burst length for transmission of data from the memory controller to a memory device based on a calibration signal 611. The calibration signal may indicate whether the memory controller is performing operations for determining an operational write latency of the memory device. In one embodiment, the calibration signal 611 may be configured to select a predefined burst length (BL) 612 during normal operations of the memory controller. The BL 612 may be a predefined burst length programmed into or retrieved from a memory device, or may be a burst length previously determined by the memory controller to be the operational burst length of the memory device.

In one embodiment, the calibration signal 611 may be configured to set the burst length to a value 613 equal to a sum of the BL 612 and 2*M, wherein M is a predefined integer value, during operations for determining the operational write latency of the memory device. In one embodiment, the value M may be determined based on a number of clock cycles within the predefined latency window of the memory device. For example, referring to FIG. 5, the latency window includes 2 clock cycles, therefore the value of M may be 2. While a value of 2*M is added to BL 612 in FIG. 6, in alternative embodiments any factor of M may be added to the BL 612 to derive the burst length 613. The increased burst length 613 may be used during operations to determine the operational write latency in order to avoid writing indeterminate values to the memory device, as discussed above in cases where data and/or strobe are allowed to transition to a high-Z state during write timing calibration.

The output of the mux 610 may be received by the burst length control circuitry 620. The burst length control circuitry 620 may generate a burst enable signal 621 based on the burst length received from the mux 610. The burst enable signal 621 may be provided to the strobe delay control circuitry 630 and data delay control circuitry 640.

The strobe delay control circuitry 630 may be configured to generate the strobe signal 631, which may be an example of the strobe signal 520 of FIG. 5, based on the burst enable signal 621, a clock signal 642, and an output of the adder 650. Specifically, the burst enable signal 621 may determine a number of clock cycles for which the strobe signal 631 will oscillate. The output of the adder 650 may determine the latency of the strobe signal 631, as will be discussed below.

The data delay control circuitry 640 may generate data signals 641 based on a clock signal 642, the burst enable signal 621, and an output of the adder 650. The clock signal 642 may be offset from the clock signal 632 such that data eyes of the data signals 641 are aligned with edges of the strobe signal 631. The data signals 641 may correspond to the data signals 530 illustrated in FIG. 5, although other strobe-to-data alignments may also be used.

The adder 650 may be configured to set the write latency during a transmission from the memory controller to the memory device. In one embodiment, during operations to determine the operational write latency of the memory device, the adder 650 may be configured to add a predefined latency 651 to a predefined write latency 652. The predefined write latency 652 may be a predefined write latency retrieved from the memory device, a write latency previously determined by the memory controller as the operational write latency, etc.

In one embodiment, the predefined latency 651 may fall within a range of −M/2 to M/2, which defines a sweep range of latencies for operations for determining the operational write latency of the memory device. −M/2 may correspond to a minimum latency, e.g., 3 clock cycles used in FIG. 5. During the operations to determine the operational write latency the memory controller may increase latency 651 by a predefined number of clock cycles during successive transmissions, thereby allowing the memory controller to sweep the data strobe signal 631 and data signal 641 until the desired operational write latency is found.

Figure 7:
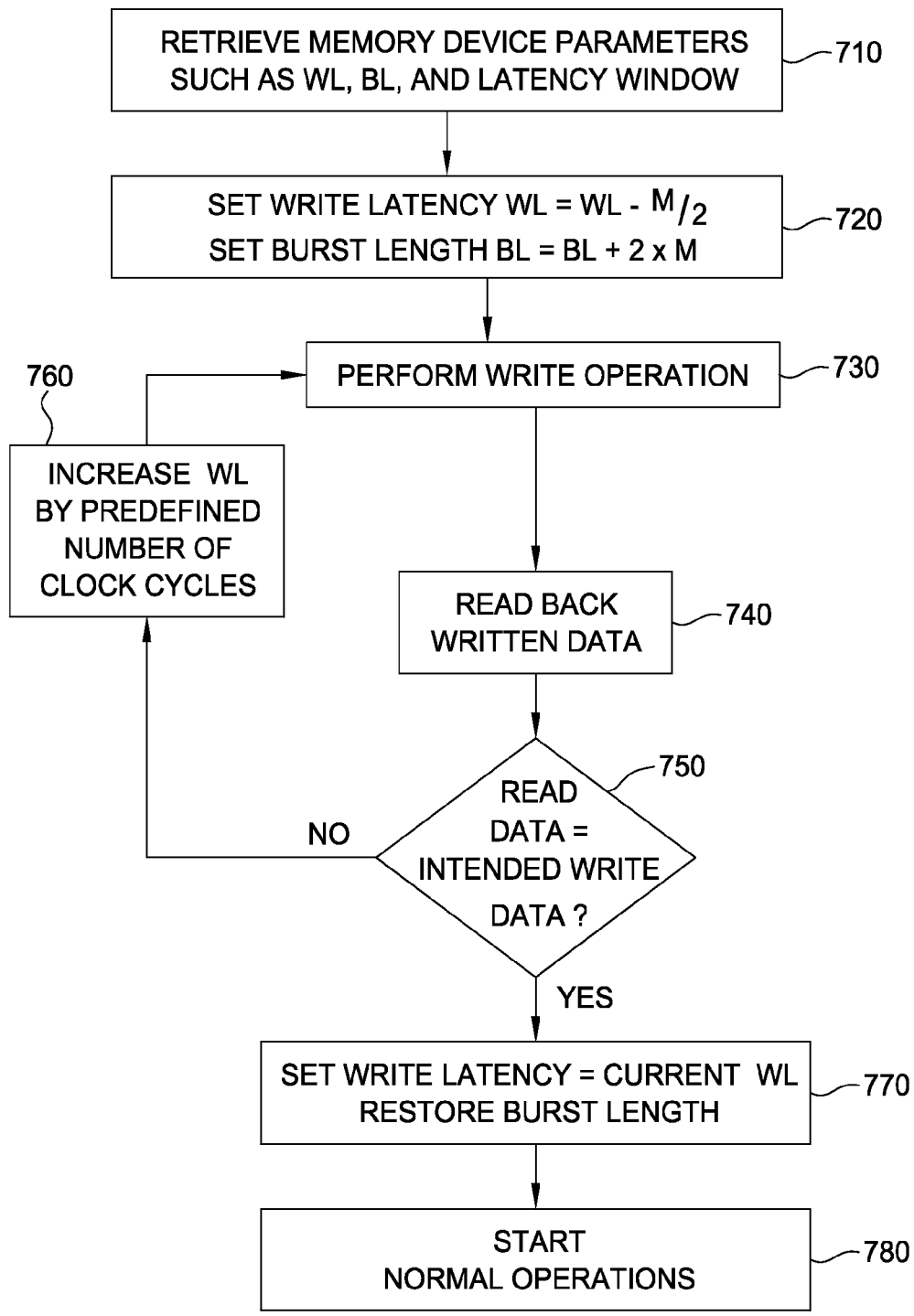
FIG. 7 is a flow diagram of exemplary operations performed by a memory controller, according to an embodiment of the invention.

FIG. 7 is a flow diagram of exemplary operations that may be performed by the memory controller during operations for determining an operational write latency of a memory device. The operations may begin in step 710 by retrieving memory device parameters such as WL, BL, and latency window. The foregoing information may be retrieved from the memory device, from a device utilized for the retention of such information and used in conjunction with one or more memory devices (e.g. the EEPROM device on a memory card or DIMM), etc. In step 720, the memory controller may set the write latency WL to WL−M/2 and the burst length BL to BL+2*M, wherein M is the number of clock cycles within the latency window of the memory device. At step 730, the memory controller may perform a write operation. Then in step 740, the memory controller may read back the written data. In step 750, the memory controller may determine whether the data read from the memory device is the data intended to be written. If not, in step 760, the memory controller may increment the WL by a predefined number of clock cycles, and return to step 730. However, if the data read from the memory device is the data that was intended to be written, in step 770, the memory controller may fix the write latency to the current value of WL, and restore the value of the burst length to burst length defined by the memory device. Thereafter, in step 780, the memory controller may start normal operations with the memory device.

In one embodiment, the memory controller may perform one or more further calibration operations prior to beginning normal operations with the memory device. For example, the memory controller may perform one or more operations for fine calibration of timing parameters. In general, fine calibration may include any operations performed to ensure that data strobe signal edges are generated at the center of a data eye. For example, the fine calibration operations may involve sweeping the edge of the strobe signal in small increments to find end points of the data eye. Based on the end points of the data eye, the center of the data eye may be determined.

Figure 8:
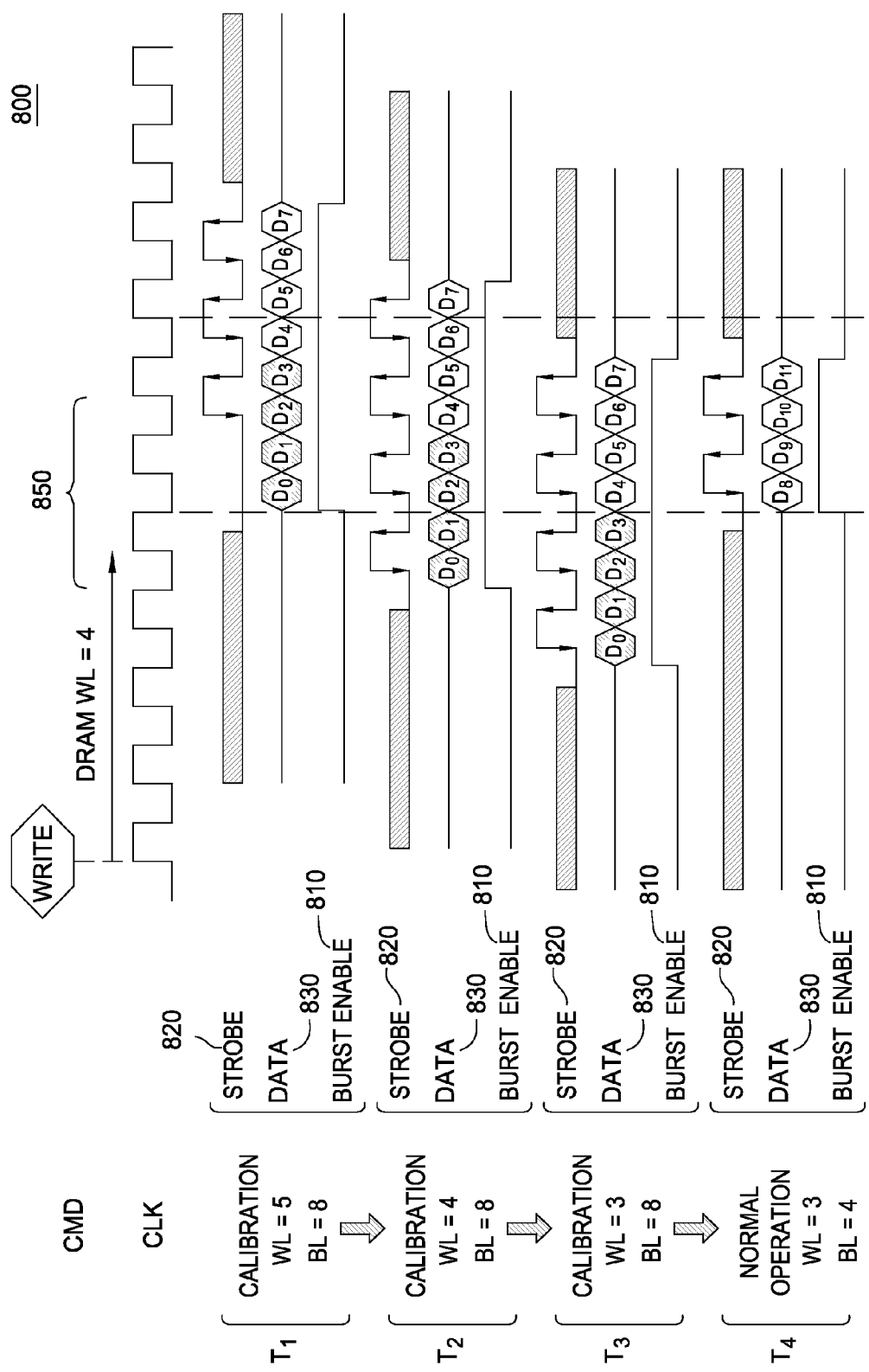
FIG. 8 illustrates another exemplary method for determining an operational write latency according to an embodiment of the invention.

FIG. 8 illustrates another exemplary method for determining the write latency of a memory device, according to an embodiment of the invention. As with previous examples, a memory device having a predefined write latency of 4 clock cycles is assumed. In this embodiment, during operations to determine an operational write latency for the memory device for accurate transmissions of data, the memory controller may first send data at a predefined maximum write latency. The predefined maximum latency may be any latency that is greater than the predefined write latency of the memory device. For example, as illustrated in FIG. 8, the maximum write latency may be 5 clock cycles, as illustrated in the initial transmission T1.

As further illustrated in FIG. 8, during the transmission T1, the burst length of the data may be greater than an operational burst length. In one embodiment, the burst length used during operations for determining the operational write latency may be at least twice the operational burst length. For example, in FIG. 8, during transmission T1, data D0-D7 may be transmitted. D4-D7 may represent the data that is intended to be written, while data D0-D3 may be additional data that is sent to provide known data in conjunction with an increased burst length. A burst enable signal 810 may be generated along with the data strobe signal 820 and data signals 830 to indicate the presence of data D0-D7 on the data bus, as shown in FIG. 8.

In one embodiment, the data D0-D7 may have a predefined pattern which may allow the memory controller to determine whether intended data is written to the memory device. For example, during transmission T1, it is likely that one or more of data D0-D3 is captured by the memory device because data D0-D3 are within the latency window 850. After the transmission T1, the memory controller may read back the written data. Because the intended data D4-D7 was not captured during the transmission T1, the memory controller may determine that the operational write latency is not 8. In an alternate exemplary embodiment, the memory controller and/or memory interface device may determine upon reading the data that the received data (e.g. D0-D3) indicates, with a high degree of confidence, that the write latency should be decreased by a larger (or known) number of clock cycles, e.g. 2 clock cycles in this example—since the data pattern written included known information for these data. This method might enable the coarse write timing calibration to be completed in a reduced amount of time.

Returning to the current embodiment, the memory controller may decrease the write latency by a predefined number of clock cycles, e.g., from 5 clock cycles to 4 clock cycles, for a second transmission T2 of data D0-D7. As illustrated in FIG. 8, during the second transmission T2, data D2-D6 fall within the latency window 850, and one or more of data D2-D6 is likely to be stored by the memory device. After reading back the data written to the memory device during transmission T2, the memory controller may determine that 4 clock cycles is not the operational write latency.

Accordingly, the memory controller may decrease the write latency further from 4 clock cycles to 3 clock cycles for a third transmission to T3. As can be seen in FIG. 8, during the third transmission T3, intended data D4-D7 may fall within the latency window 850, and therefore data D4-D7 may be captured by the memory device. Upon reading back the data written during transmission T3, the memory controller may determine that 3 clock cycles is the appropriate operational write latency for future transmissions of data. Therefore, the memory controller may set the write latency for normal operation of the memory device to 3 clock cycles.

Upon determining that the operational write latency for the memory device is 3 clock cycles, the memory controller may reset the burst length to the predefined burst length of the memory device for future transmissions. FIG. 8 illustrates transmission (T4) of write data D8-D11 after the operational write latency has been determined. As shown, during transmission T4, a burst length of 4 and a write latency of 3 clock cycles is used, thereby placing the data D8-D11 within the latency window 850 of the memory device.

In one embodiment, the circuit 600 of FIG. 6 may be adapted to implement the method illustrated in FIG. 8. For example, instead sweeping the latency 651 of the adder 650 from the minimum latency −M/2 to greater latencies, the memory controller may sweep the latency 651 from the maximum latency M/2 to lower frequencies to determine the operational write latency.

Figure 9:
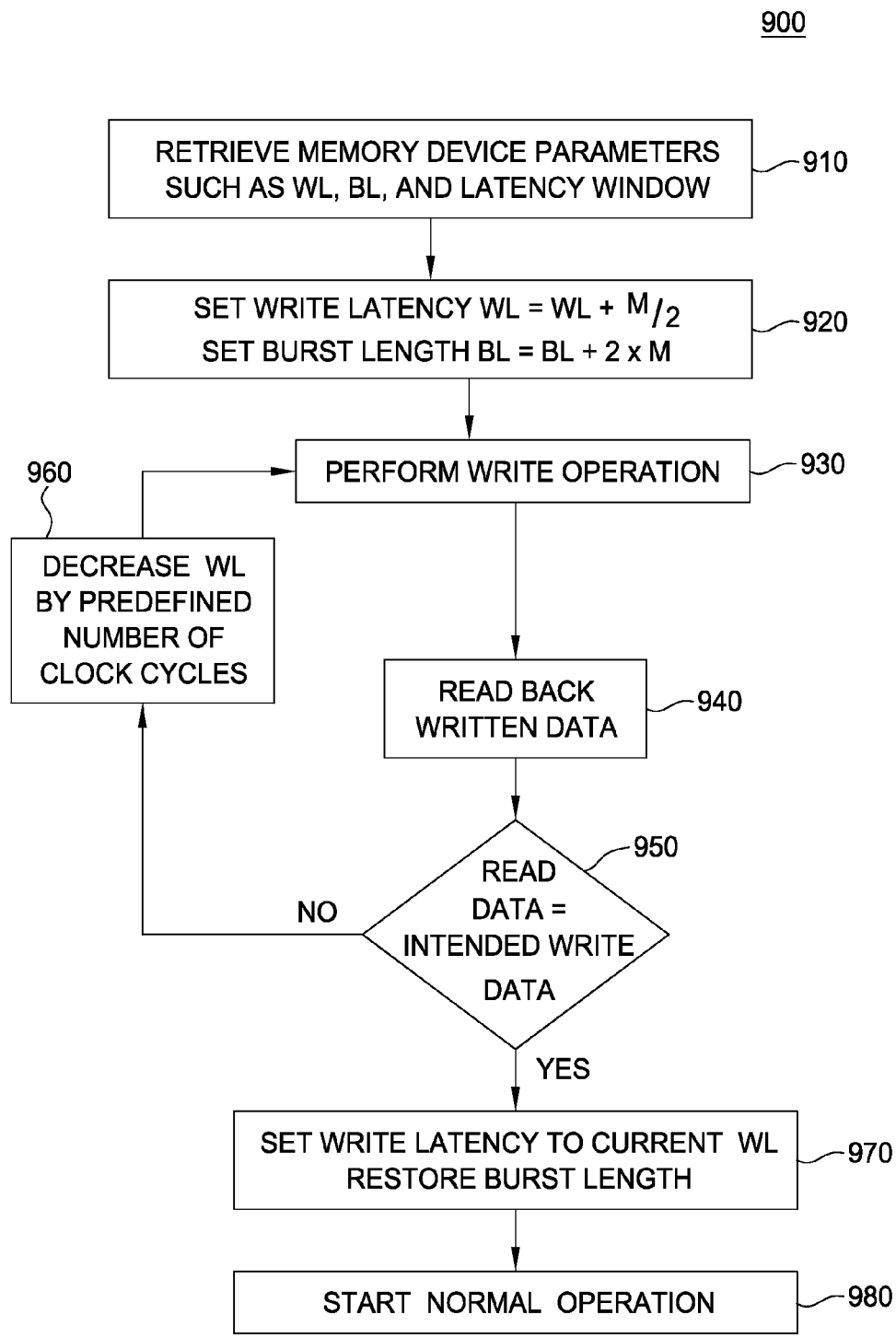
FIG. 9 is a flow diagram of exemplary operations performed by a memory controller, according to an embodiment of the invention.

FIG. 9 is a flow diagram of exemplary operations that may be performed by the memory controller during operations for determining an operational write latency of a memory device. The operations may begin in step 910 by retrieving memory device parameters such as WL, BL, and latency window— such as previously described. In step 920, the memory controller may set the write length WL to WL+M/2 and the burst length BL to BL+2*M, wherein M is the number of clock cycles within the latency window of the memory device. At step 930, the memory controller may perform a write operation. Then in step 940, the memory controller may read back the written data. In step 950, the memory controller may determine whether the data read from the memory device is the data intended to be written. If not, in step 960, the memory controller may reduce the WL by a predefined number of clock cycles, and return to step 930. However, if the data read from the memory device is the data that was intended to be written, in step 970, the memory controller may fix the write latency to the current value of WL, and restore the value of the burst length to burst length defined by the memory device. Thereafter, in step 980, the memory controller may start normal operations with the memory device, continue calibration procedures on the memory device including such procedures as fine timing adjustments to maximize the data capture timing margins, initiate coarse timing adjustments to other memory device(s), etc.

Figure 10:
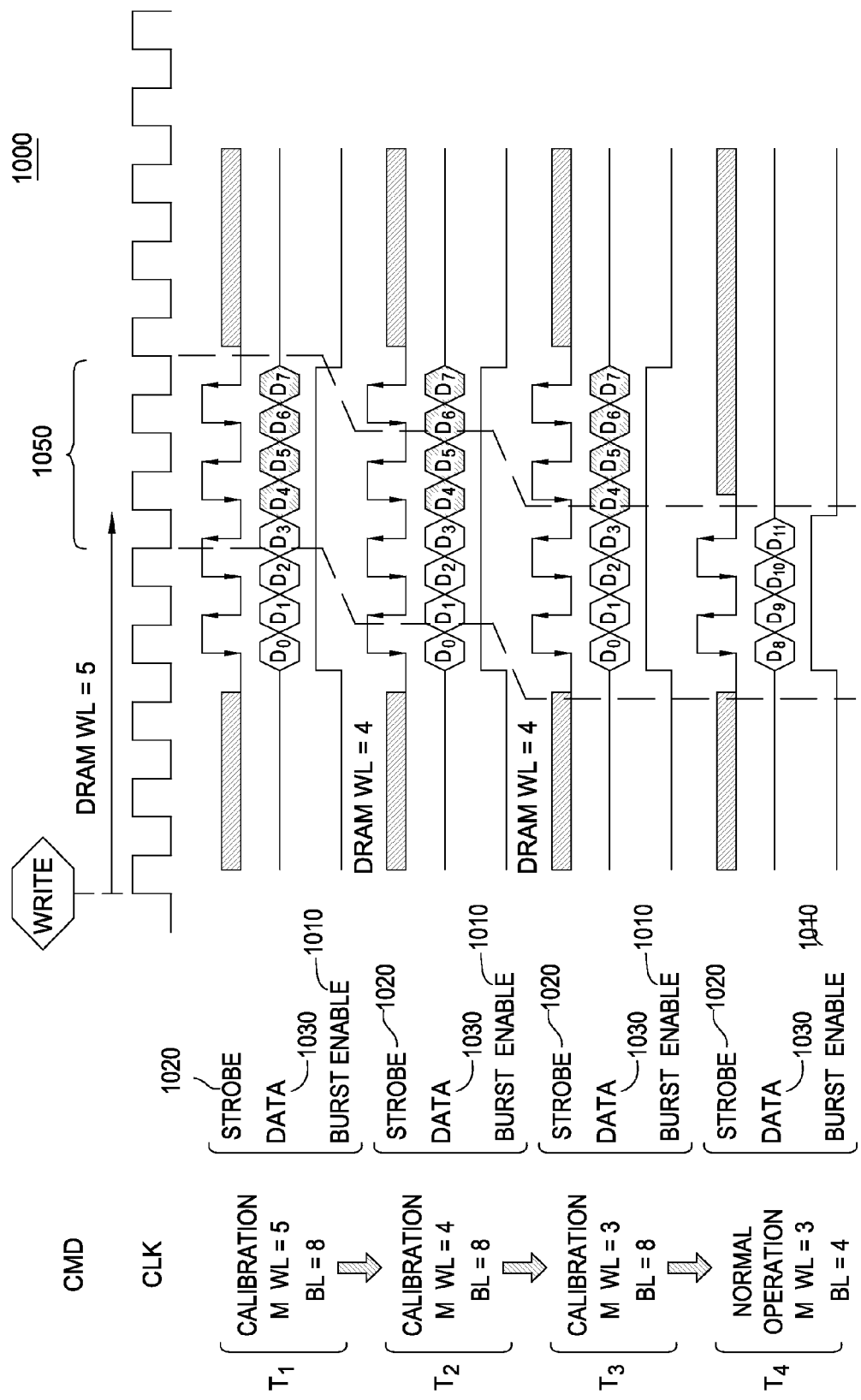
FIG. 10 illustrates an exemplary method for determining an operational latency window according to an embodiment of the invention.

In some embodiments, the latency window of the memory device may be shifted by one or more clock cycles to ensure that data transferred from the memory controller is received within the latency window. The shifted latency window is referred to herein as an operational latency window. FIG. 10 illustrates exemplary operations for determining the operational latency window for a memory device according to an embodiment of the invention. As with previous examples, a memory device having a predefined write latency of 4 clock cycles is assumed. In this embodiment, during operations to determine the operational memory latency window for accurate transmissions of data, the memory controller may always send data at a predefined write latency of the memory device. For example, in FIG. 10, the write latency of the memory device is fixed at 5 clock cycles, as illustrated in the initial transmissions T1-T4. The latency window of the memory device may initially be set based on the write latency.

As illustrated in FIG. 10, during the transmission T1, the burst length of the data may be greater than an operational burst length. In one embodiment, the burst length used during operations for determining the operational write latency may be at least twice the operational burst length. For example, in FIG. 10, during transmission T1, data D0-D7 may be transmitted. D0-D3 may represent the data that is intended to be written, while data D4-D7 may be additional data that is sent to provide for known data during the increased burst length. A burst enable signal 1010 may be generated along with the data strobe signal 1020 and data signals 1030 to indicate the presence of data D0-D7 on the data bus, as shown in FIG. 10.

In one embodiment, the data D0-D7 may have a predefined pattern which may allow the memory controller to determine whether intended data is written to the memory device. For example, during transmission T1, it is likely that one or more of data D3-D7 is captured by the memory device because data D3-D7 are within the latency window 1050. After the transmission T1, the memory controller may read back the written data. Because the intended data D0-D3 was not captured during the transmission T1, the memory controller may determine that the latency window 1050 is not desirable.

Accordingly, the memory controller may shift the latency window by a predefined number of clock cycles, e.g., by 1 clock cycle to the left, for a second transmission T2 of data D0-D7. As illustrated in FIG. 10, during the second transmission T2, data D1-D5 fall within the latency window 1050, and one or more of data D1-D5 is likely to be captured by the memory device. After reading back the data written to the memory device during transmission T2, the memory controller may determine that the shifted latency window in T2 is also not desirable.

Accordingly, the memory controller may further shift the latency window for a third transmission to T3. As can be seen in FIG. 10, during the third transmission T3, intended data D0-D3 may fall within the shifted latency window 1050, and therefore data D0-D3 may be captured by the memory device. Upon reading back the data written during transmission T3, the memory controller may determine that the current shifted latency window is desirable as the operational latency window for future transmissions of data. Therefore, the memory controller may set the shifted latency window 1050 of transmission T3 as the latency window of the memory device for normal operation. Setting the latency window if the memory device may generally involve accessing one or more registers of the memory device and rewriting one or more timing parameters included therein.

Upon determining that the desirable operational latency window, the memory controller may reset the burst length to the predefined burst length of the memory device for future transmissions. FIG. 10 illustrates transmission (T4) of write data D8-D11 after the operational latency window has been determined. As shown, during transmission T4, a burst length of 4 and a shifted latency window is used, thereby placing the data D8-D11 within the latency window 1050 of the memory device. While shifting the latency window to the left is disclosed herein, in alternative embodiments, the latency window may be shifted to the right until desired data falls within the shifted latency window.

Figure 11:
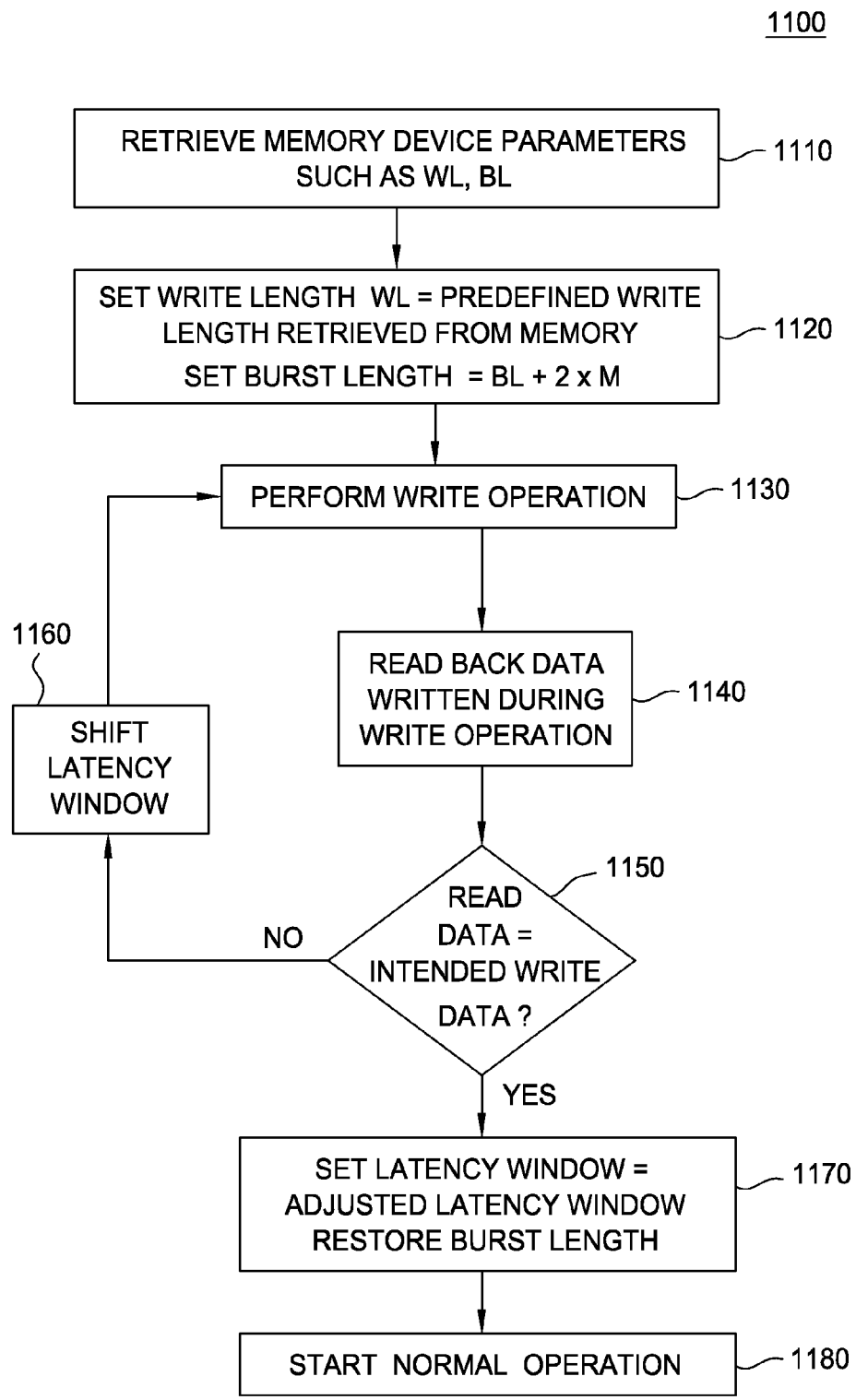
FIG. 11 is a flow diagram of exemplary operations performed by a memory controller, according to an embodiment of the invention.

FIG. 11 is a flow diagram of exemplary operations that may be performed by the memory controller during operations for determining an operational latency window for a memory device. The operations may begin in step 1110 by retrieving memory device parameters such as WL, BL, and latency window. In step 1120, the memory controller may set the write length WL to the predefined write length retrieved from the memory device, and the burst length BL to BL+2*M, wherein M is the number of clock cycles within the latency window of the memory device. At step 1130, the memory controller may perform a write operation. Then in step 1140, the memory controller may read back the written data. In step 1150, the memory controller may determine whether the data read from the memory device is the data intended to be written. If not, in step 1160, the memory controller may shift the latency window by a predefined number of clock cycles, and return to step 1130. However, if the data read from the memory device is the data that was intended to be written, in step 1170, the memory controller may fix the latency window of the memory device to the current shifted latency window, and restore the value of the burst length to burst length defined by the memory device. Thereafter, in step 1180, the memory controller may start normal operations with the memory device.

While calibrating a write latency of a memory device and a latency window of a memory device are discussed separately hereinabove, in alternative embodiments, calibration of write latency and latency windows may be performed simultaneously. For example, write latency may be iteratively incremented while simultaneously shifting a latency window to the left until the data and data strobe signals fall within the latency window.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A method for calibrating parameters of a memory device, the method comprising:
   (a) setting a write latency associated with the memory device to a first value, the write latency is a period of time between transmitting a write command and transmitting data associated with the write command to the memory device;
   (b) changing a burst length such that a data sequence transmitted to the memory device is greater than the amount of data that can be captured during a read window of the memory device;
   (c) after changing the burst length, performing a write operation using the write latency, wherein the data sequence is transmitted to the memory device;
   (d) performing a read operation to retrieve a data portion written during the write operation of step (c), wherein the retrieved data portion is a subset of the data sequence transmitted at step (c); and,
   (e) upon determining that the retrieved data portion is different from an expected data portion of the data sequence transmitted to the memory device at step (c), adjusting the write latency by at least one clock cycle to alter the retrieved data portion read from the memory device at step (d);

(f) repeating steps (c)-(e) until the retrieved data portion is equal to the expected data portion of the data sequence; and (g) upon determining that the retrieved data portion is equal to the expected data portion, performing normal operation of the memory device using the adjusted write latency and changing the burst length such that subsequent data sequences transmitted to the memory device are equal to or less than the read window.

2. The method of claim 1, wherein the first value is a minimum write latency value determined by subtracting half of a number of clock cycles in a predefined latency window of the memory device from a predefined write latency retrieved from the memory device, and wherein adjusting the write latency comprises increasing the write latency by at least one clock cycle.

3. The method of claim 1, wherein the first value is a maximum write latency value determined by adding half of a number of clock cycles in a predefined latency window of the memory device to a predefined write latency retrieved from the memory device, and wherein adjusting the write latency comprises decreasing the write latency by at least one clock cycle.

4. The method of claim 1, further comprising retrieving a predefined burst length from the memory device, wherein the burst length used for transmitting the data sequence of the write operation is determined by adding at least twice a number of clock cycles in the latency window to a predefined burst length retrieved from the memory device.

5. The method of claim 1, wherein performing the write operation comprises generating a data strobe signal and a test data sequence, wherein the test data sequence has a predefined pattern and comprises the data sequence and a different portion of data, wherein the entire test data sequence is transmitted to the memory device during the write operation.

6. A method for calibrating parameters of a memory device, the method comprising:

(a) changing a burst length such that a data sequence transmitted to the memory device is greater than an amount of data that can be captured during a latency window associated with the memory device, the latency window is a time period during which the memory device is configured to receive transmitted data;

(b) after changing the burst length, performing a write operation, based on transmitting the data sequence to the memory device using the latency window;

(c) performing a read operation to retrieve a data portion written during the write operation of step (b), wherein the retrieved data portion is a subset of the data sequence transmitted at step (b); and (d) upon determining that the retrieved second data portion is different from an expected data portion of the data sequence transmitted to the memory device at step (b), shifting the latency window of the memory device by at least one clock cycle to alter the retrieved data portion read from the memory device at step (c);

(e) repeating steps (b)-(d) until the retrieved data portion is equal to the expected data portion of the data sequence; and (f) upon determining that the retrieved data portion is equal to the expected data portion transmitted to the memory device during the write operation, performing normal operation of the memory device using the shifted latency window and changing the burst length such that subsequent data sequences transmitted to the memory device are equal to or less than the latency window.

7. The method of claim 6, wherein shifting the latency window comprises delaying the latency window by at least one clock cycle.

8. The method of claim 6, wherein shifting the latency window comprises moving the latency window forward in time by at least one clock cycle.

9. The method of claim 6, further comprising retrieving a predefined burst length from the memory device, wherein the burst length used for transmitting the data sequence of the write operation is determined by adding at least twice a number of clock cycles in the latency window to the predefined burst length retrieved from the memory device.

10. The method of claim 6, wherein performing the write operation comprises generating a data strobe signal and a test data sequence, wherein the test date sequence has a predefined pattern and comprises the data sequence and a different data portion, wherein the entire test data sequence is transmitted to the memory device during the write operation.

11. A system, comprising:
a memory device; and
a memory controller configured to:

(a) set a write latency associated with the memory device to a first value, the write latency is a period of time between transmitting a write command and transmitting a data sequence associated with the write command to the memory device;

(b) change a burst length such that the data sequence transmitted to the memory device is greater than the amount of data that can be captured during a read window of the memory device;

(c) after changing the burst length, perform a write operation using the write latency, wherein the data sequence is transmitted to the memory device;

(d) perform a read operation to retrieve a data portion written during the write operation of step (c), wherein the retrieved data portion is a subset of the data sequence transmitted at step (c); and (e) upon determining that the retrieved data portion is different from an expected data portion of the data sequence transmitted to the memory device at step (c), adjust the write latency by at least one clock cycle to alter the retrieved data portion read from the memory device at step (d); and (f) repeat steps (c)-(e) until the retrieved data portion is equal to the expected data portion; and (g) upon determining that the retrieved data portion is equal to the expected data portion, perform normal operation of the memory device using the adjusted write latency and change the burst length such that subsequent data sequences transmitted to the memory device are equal to or less than the read window.

12. The system of claim 11, wherein the first value is a minimum write latency value determined by subtracting half of a number of clock cycles in a predefined latency window of the memory device from a predefined write latency retrieved from the memory device.

13. The system of claim 11, wherein the memory controller is configured to adjust the write latency by increasing the write latency by at least one clock cycle.

14. The system of claim 11, wherein the first value is a maximum write latency value determined by adding half of a number of clock cycles in a predefined latency window of the memory device to a predefined write latency retrieved from the memory device.

15. The system of claim 14, wherein the memory controller is configured to adjust the write latency by decreasing the write latency by at least one clock cycle.

16. The system of claim 11, further comprising retrieving a predefined burst length from the memory device, wherein the burst length used for transmitting the data sequence of the write operation is determined by adding at least twice a number of clock cycles in the latency window to the predefined burst length retrieved from the memory device.

* * * * *